(12) United States Patent
O et al.

(10) Patent No.: US 7,511,533 B1
(45) Date of Patent: Mar. 31, 2009

(54) OUTPUT DEVICE HAVING PARASITIC TRANSISTOR FOR INCREASED CURRENT DRIVE

(75) Inventors: Hugh Sungki O, Fremont, CA (US); Chih-Ching Shih, Pleasanton, CA (US); Cheng-Hsiung Huang, Cupertino, CA (US); Yow-Juang Bill Liu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 413 days.

(21) Appl. No.: 11/364,779

(22) Filed: Feb. 27, 2006

(51) Int. Cl.
*H03K 19/0175* (2006.01)

(52) U.S. Cl. .............................. 326/81; 326/83; 327/534

(58) Field of Classification Search ............. 326/80–87; 327/534, 535
See application file for complete search history.

(56) References Cited

U.S. PATENT DOCUMENTS 5,748,016 A * 5/1998 Kurosawa ................... 327/108
6,191,615 B1 * 2/2001 Koga ............................ 326/81
6,366,141 B1 * 4/2002 Chiba et al. ................. 327/108
6,404,243 B1 * 6/2002 Koch et al. .................. 327/107

* cited by examiner

*Primary Examiner*—Don P Le
(74) *Attorney, Agent, or Firm*—Townsend and Townsend and Crew LLP

(57) ABSTRACT

Circuits, methods, and apparatus for output devices having parasitic transistors for a higher output current drive. One such MOS output device includes a parasitic bipolar transistor that assists output voltage transitions. The parasitic transistor may be inherent in the structure of the MOS device. Alternately, one or more regions, such as implanted or diffused regions, may be added to the MOS device to form or enhance the parasitic bipolar device. The parasitic transistor is turned on when during an appropriate output transition and turned off once the transition is complete. The parasitic device may be turned on by injecting current into the bulk of a pull-down device, by pulling current out of the bulk of a pull-up device, or by tying the bulk of the output device to an appropriate voltage, such as VCC for a pull-down device or ground for a pull-up device.

20 Claims, 10 Drawing Sheets

OUTPUT DEVICE HAVING PARASITIC TRANSISTOR FOR INCREASED CURRENT DRIVE

BACKGROUND

The present invention relates generally to output devices for integrated circuits, and more particularly to output devices having parasitic transistors for increased current drive.

The data rates required of integrated circuit inputs and outputs has increased dramatically the past few years, and the demand for ever higher data rates shows no signs of abating. Higher data rates mean that capacitances at device input and output pins need to be driven more quickly; this requires higher output currents to be provided by output devices.

Process changes can provide part of the solution. For example, as transistor gate lengths become smaller, the current driving capability of a device is increased. But for a specific technology or process, increasing the drive capability of an output device becomes difficult.

Conventional techniques used to increase current drive are limited by various tradeoffs. For example, the size of an output device can be increased. However, the use of a larger device increases output capacitance, which diminishes the gain in performance that would otherwise be achieved. Also, the sizes of devices driving the gate of the output device must be scaled larger when an output device's size is increased, thereby increasing power dissipation.

Another conventional solution is to increase the voltage amplitude of the signal driving the output device. Providing a higher gate-to-source voltage to an output device increases its output current. But power dissipation is a major concern in modern integrated circuits. Accordingly, device power supply voltages have been decreasing over time, reducing the available voltage drive. In any event, a higher voltage drive can lead to oxide problems in the output device caused by hot-carrier injection or time-dependent dielectric breakdown.

Accordingly, what is needed are circuits, methods, and apparatus that provide output devices having an increased drive capability. These devices can be used to provide higher currents for a given device size. These devices could also be used to reduce device sizes while maintaining a certain drive capability. Such output devices could be used to provide a more efficient output device, that is, an output device that is capable of providing a larger output current for a given die area.

Accordingly, embodiments of the present invention provide circuits, methods, and apparatus for output devices having parasitic transistors for a higher output current drive capability.

An exemplary embodiment of the present invention provides a MOS output device having a parasitic bipolar transistor that assists output voltage transitions. The parasitic transistor may be inherent in the structure of the MOS device. Alternately, one or more regions, such as implanted or diffused regions, may be added to the MOS device to form or enhance the parasitic bipolar device. The parasitic transistor is turned on during an appropriate output transition and turned off once the transition is complete. The parasitic device may be turned on by injecting current into the bulk of a pull-down device, by pulling current out of the bulk of a pull-up device, or by tying the bulk of the output device to an appropriate voltage, such as VCC for a pull-down device or ground for a pull-up device.

A specific embodiment of the present invention provides an n-channel pull-down device having a parasitic NPN device. The NPN device is turned on either by injecting base current into the bulk of the MOS pull-down device, or by tying the bulk of the MOS pull-down device to an appropriate voltage such as VCC. The base current is injected during the time after the pull-down device receives a low-to-high voltage transition at its gate and before an output voltage at its drain reaches a low level.

A specific embodiment of the present invention prevents substrate leakage currents by tying the bulk of the MOS device to its source during at least some of the time that base current is not being injected into its bulk. Various embodiments of the present invention may incorporate one or more of these and the other features described herein.

A better understanding of the nature and advantages of the present invention may be gained with reference to the following detailed description and the accompanying drawings.

DESCRIPTION OF EXEMPLARY EMBODIMENTS

Figure 1:
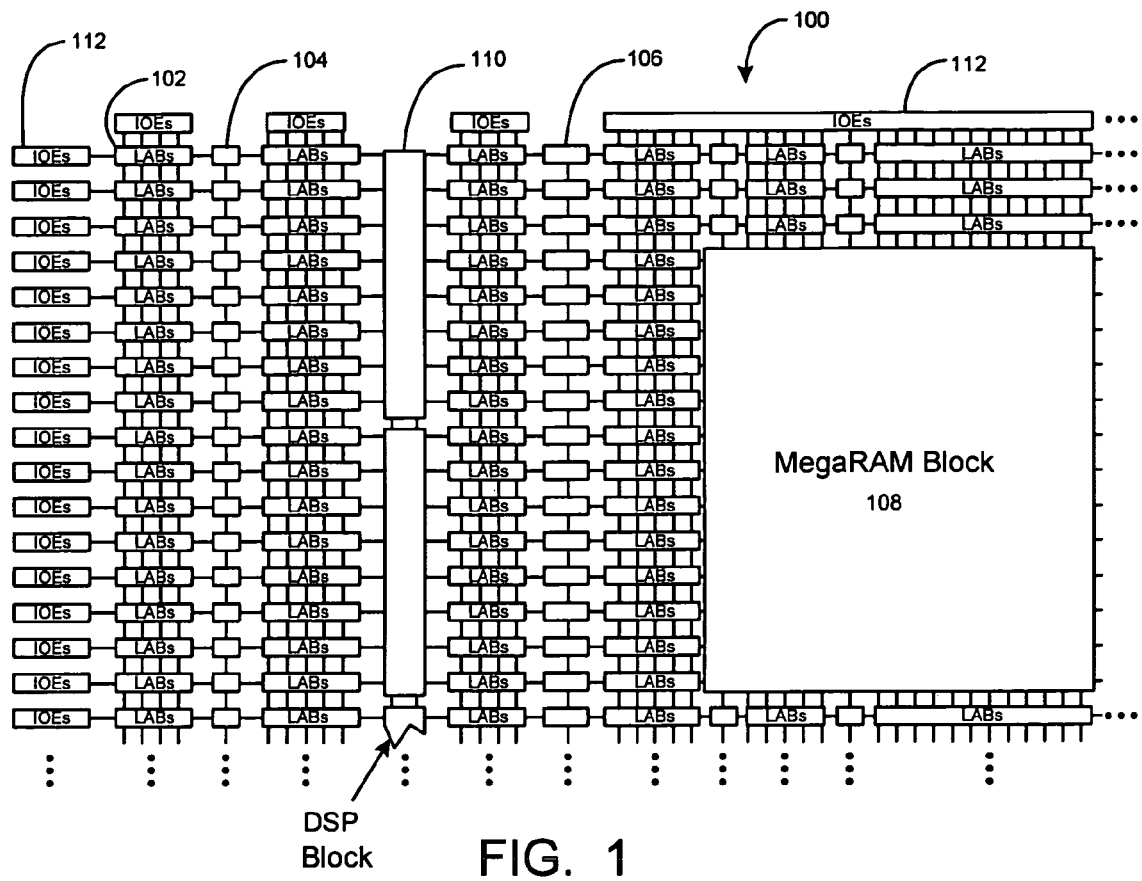
FIG. 1 is a simplified block diagram of a programmable logic device that is improved by incorporating embodiments of the present invention.

FIG. 1 is a simplified partial block diagram of an exemplary high-density programmable logic device 100 wherein techniques according to the present invention can be utilized. PLD 100 includes a two-dimensional array of programmable logic array blocks (or LABs) 102 that are interconnected by a network of column and row interconnections of varying length and speed. LABs 102 include multiple (e.g., 10) logic elements (or LEs), an LE being a small unit of logic that provides for efficient implementation of user defined logic functions.

PLD 100 also includes a distributed memory structure including RAM blocks of varying sizes provided throughout the array. The RAM blocks include, for example, 512 bit blocks 104, 4K blocks 106, and an M-Block 108 providing 512K bits of RAM. These memory blocks may also include shift registers and FIFO buffers. PLD 100 further includes digital signal processing (DSP) blocks 110 that can implement, for example, multipliers with add or subtract features.

It is to be understood that PLD 100 is described herein for illustrative purposes only and that the present invention can be implemented in many different types of PLDs, FPGAs, and the other types of digital integrated circuits.

Figure 2:
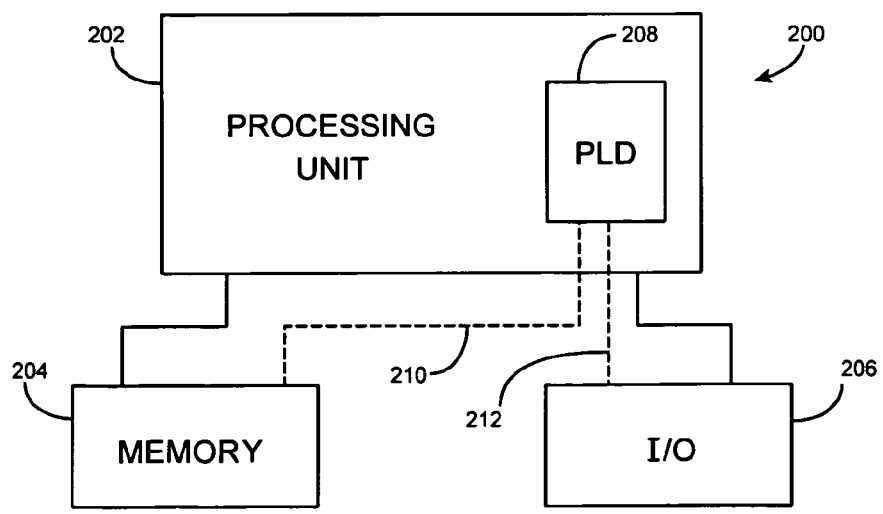
FIG. 2 is a block diagram of an electronic system that is improved by incorporating embodiments of the present invention.

While PLDs of the type shown in FIG. 1 provide many of the resources required to implement system level solutions, the present invention can also benefit systems wherein a PLD is one of several components. FIG. 2 shows a block diagram of an exemplary digital system 200, within which the present invention may be embodied. System 200 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 200 may be provided on a single board, on multiple boards, or within multiple enclosures.

System 200 includes a processing unit 202, a memory unit 204 and an I/O unit 206 interconnected together by one or more buses. According to this exemplary embodiment, a programmable logic device (PLD) 208 is embedded in processing unit 202. PLD 208 may serve many different purposes within the system in FIG. 2. PLD 208 can, for example, be a logical building block of processing unit 202, supporting its internal and external operations. PLD 208 is programmed to implement the logical functions necessary to carry on its particular role in system operation. PLD 208 may be specially coupled to memory 204 through connection 210 and to I/O unit 206 through connection 212.

Processing unit 202 may direct data to an appropriate system component for processing or storage, execute a program stored in memory 204 or receive and transmit data via I/O unit 206, or other similar function. Processing unit 202 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLD 208 can control the logical operations of the system. In an embodiment, PLD 208 acts as a reconfigurable processor, which can be reprogrammed as needed to handle a particular computing task. Alternately, programmable logic device 208 may itself include an embedded microprocessor. Memory unit 204 may be a random access memory (RAM), read only memory (ROM), fixed or flexible disk media, PC Card flash disk memory, tape, or any other storage means, or any combination of these storage means.

Again, data rates at the input and output pins of devices such as these field programmable gate arrays have greatly increased the past few years. Accordingly, output devices at these pins need to be able to provide significant currents such that voltage transitions are made sufficiently quickly. As mentioned above, conventional solutions are often lacking. For example, device sizes may be increased in order to provide greater current flow. However, these larger devices have associated parasitic capacitances that slow output transitions. Further, these larger devices require correspondingly larger devices to drive them, which thereby increases on-chip power supply dissipation. Also, larger devices consume valuable die real estate, which increases integrated circuit costs.

Alternately, the transistors can be overdriven, that is driven using larger gate-to-source voltage, in order to provide a higher output current. However, to reduce on-chip power supply dissipation, power supplies have been reduced in recent years. Also, gate thickness on modern devices are thin enough that over driving then can cause oxide problems due to hot carrier effects and time-dependent dielectric breakdown.

Accordingly, embodiments of the present invention provide an output device having a parasitic bipolar transistor that is selectively activated. In one specific embodiment of the present invention, the bipolar transistor is activated or turned on while an output voltage is transitioning from one voltage level to another. A schematic of one such output buffer is a shown in the following figure.

Figure 3:
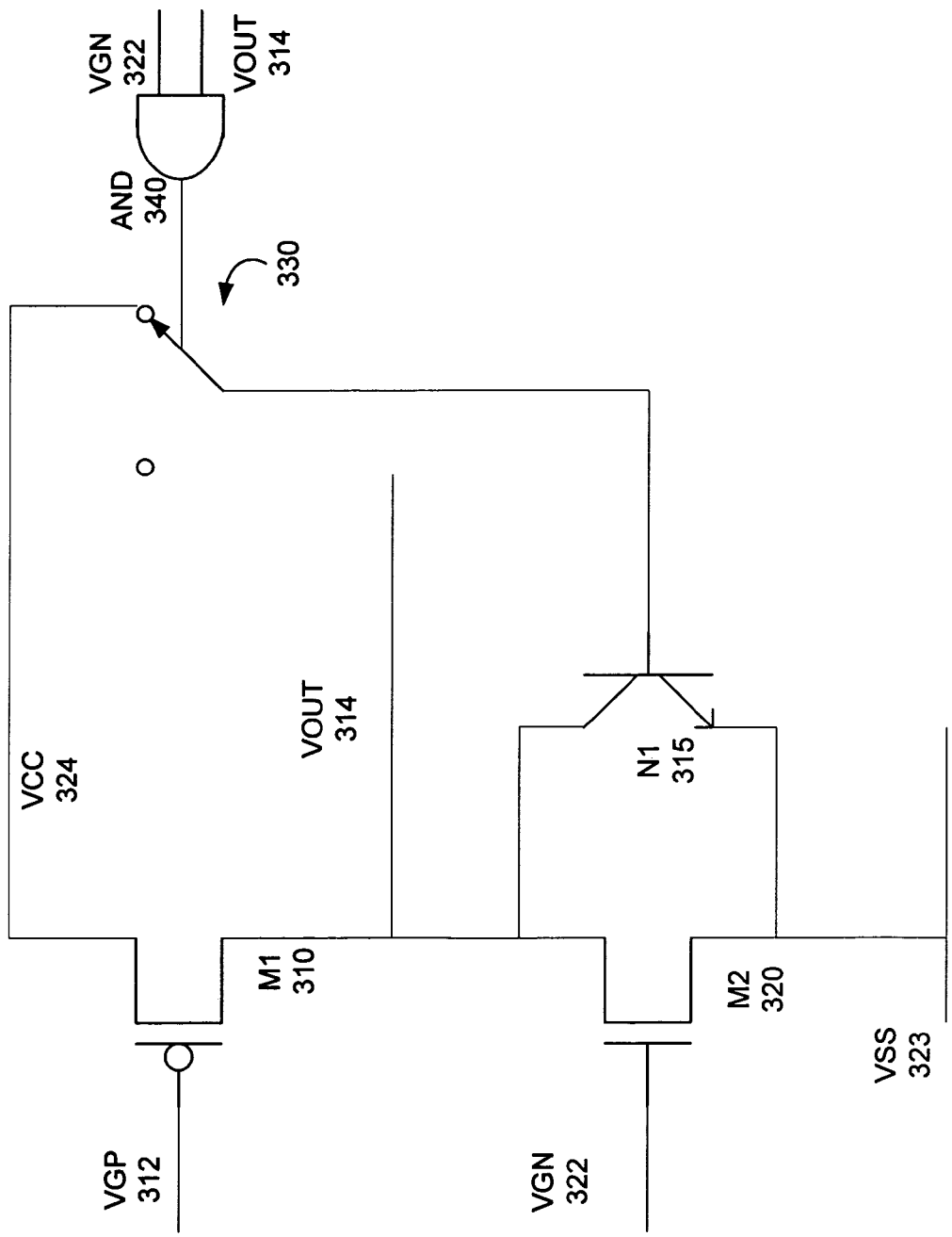
FIG. 3 is a schematic of an output buffer that is consistent with an embodiment of the present invention.

FIG. 3 is a schematic of an output buffer that is consistent with an embodiment of the present invention. This figure includes a pull-up device M1 310, pull-down device M2 320, switch 330, and AND gate 340. A parasitic NPN transistor N1 315 of the pull-down device M2 320 is shown as a separate device. In practical embodiments of the present invention, N1 315 is not a separate device, but is a parasitic device formed by the implanted or diffused regions of the transistors M2 320.

An input signal VGP is received on line 312 at the gate of pull-up device M1 310, while an input signal VGN is received on line 322 by the gate of pull-down device M2 320. Typically, the signals VGP 312 and VGN 322 are similar signals, though they may be provided by separate buffers and have different voltage swings. That is, the voltage swings of the signals VGP on line 312 and VGN on line 322 may be optimized to drive the devices M1 310 and M2 320.

The sources of pull-up device M1 310 and pull-down device M2 320 are connected to voltage terminals VCC on line 324 and VSS on line 323. In a typical embodiment, the VSS 323 has a potential of ground, while VCC on line 324 has a positive potential with respect to ground. For example, VCC may be 1.0, 1.5, 1.8, 2.2, or 2.5 volts, or other voltage. In other embodiments, the top rail VCC 324 may be ground or another potential, while VSS 323 may be a voltage below ground or another appropriate voltage. Each of these voltages, VCC on line 324 or VSS on line 323, may be a supply voltage, ground, bias voltage, reference voltage, or other appropriate node.

The drains of M1 310 and M2 320 are connected to a pad, here labeled VOUT 314. After the signals VGP on line 312 and VGN on line 322 transition from low to high logic levels, the signal VOUT 314 transitions from a high to a low level. To help with this transition, a parasitic NPN device N1 315 is used. In one embodiment of the present invention, this parasitic device his made up of the junctions inherent in device M2 320.

Specifically, when the switch 330 connects the base of N1 315 to VCC on line 324, transistor N1 315 turns on providing a current path from VOUT on line 314 to VSS on line 323. When the switch 330 is in the open position, the base current for parasitic transistor N1 315 is shut off, thereby disabling this alternate current path.

In this embodiment, the switch is controlled by AND gate 340, whose inputs are VGN on line 322 and VOUT on line 314. When both of these inputs are high, the output of the AND gate 340 is high, thereby connecting the base of N1 315 to VCC on line 324 via the switch 330. In this configuration, base current is provided to transistor N1 315, and transistor N1 315 turns on providing a current path from VOUT on line 314 to VSS on line 323. When either VGN on line 322 or VOUT on line 314 are low, the output of the AND gate 340 is low, thereby opening switch 330 and disconnecting the base of transistor N1 315 from VCC on line 324.

Specifically, as VGN on line 322 goes high, transistor M2 320 turns on providing current pulling VOUT on line 314 low, that is, towards VSS on line 323. While VGN is high, but before Vout returns low, base current is provided to the parasitic transistor N1 315. Once Vout returns low, this base current is shut off.

This and the other included figures are shown for explanatory purposes, and do not limit either the possible embodiments of the present invention or the claims. For example, while the figures generally refer to an n-channel MOS pull-down device having a parasitic NPN bipolar transistor, embodiments may also be used to improve a p-channel MOS pull-up device having a parasitic PNP bipolar transistor.

Figure 4:
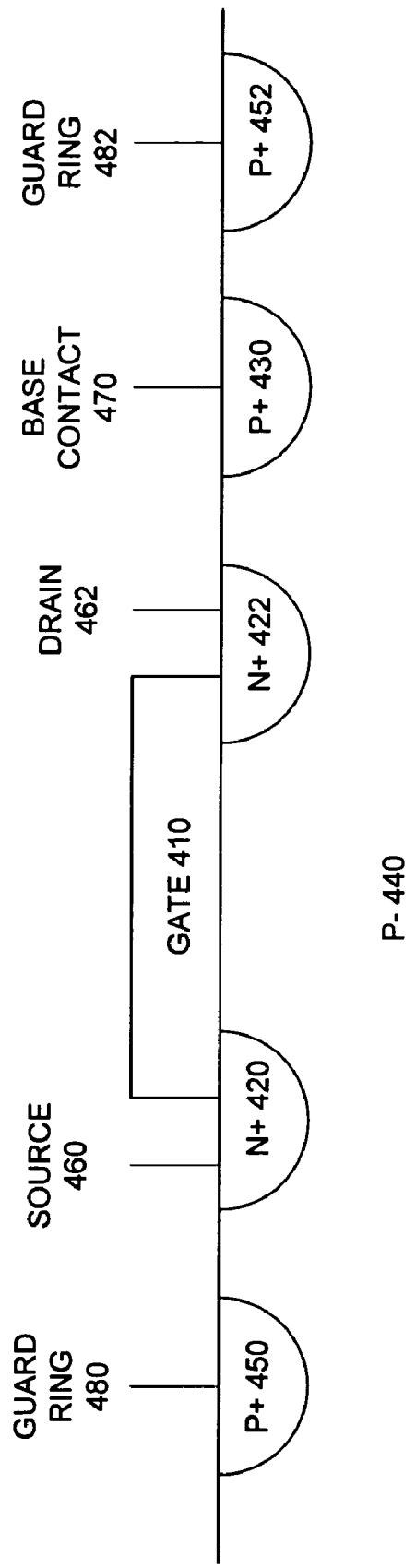
FIG. 4 is a side view of a transistor that may be used as transistor M2 320 in FIG. 3, or as a pull-down transistor in another embodiment of the present invention.

FIG. 4 is a side view of a transistor that may be used as transistor M2 320 in FIG. 3, or as a pull-down transistor in another embodiment of the present invention. This figure includes a gate 410, source contact 460 and drain contact 462, base contact 470, and guard ring contacts 480 and 482. The source contact 460 and the drain contact 462 are connected to source region 420 and drain region 422 respectively. The base contact 470 is connected to P+ region 430, while the guard rings 480 and 482 are connected to P+ regions 450 and 452 respectively.

During typical MOS device operation, a positive voltage on the gate 410 draws N+ carriers into the channel region below the gate in the epitaxial or substrate region 440. Current can then flow between the drain connection 462 and the source connection 460.

The parasitic NPN transistor N1 315 in FIG. 3 is a lateral device. This lateral device has N+ source region 420 as its emitter, P epitaxial or substrate region 440 as its base, and N+ drain region 422 as its collector. When the base contact 470 is either pulled sufficiently high or sufficient current is injected into the base contact 470, the diode between the P epitaxial or substrate 440 and N+ source region 420 forward biases and begins to conduct. This current activates the lateral NPN and collector current flows from the collector-N+ drain region 422-to the emitter-N+ source region 420.

In various embodiments of the present invention, the voltage of the base contact 470 may either be pulled high, or current may be injected into the node. For example, the base contact 470 may be pulled to a sufficiently high voltage through a resistance, such as the resistance of one or more MOS transistors.

When activating the parasitic lateral transistor, care should be taken to avoid latch-up conditions. Accordingly, the guard rings 480 and 482, which are connected to P+ regions 450 and 452, may be used. These rings can be grounded to provide a low-impedance path for excess base region carriers, thus reducing the likelihood of a latch-up.

The transistor of FIG. 4 is formed in a P-type epitaxial or substrate region. In other embodiments, the transistor M2 320 may be formed in a P-well that sits in an N epitaxial or substrate region. An example of such a device is shown in the following figure.

Figure 5:
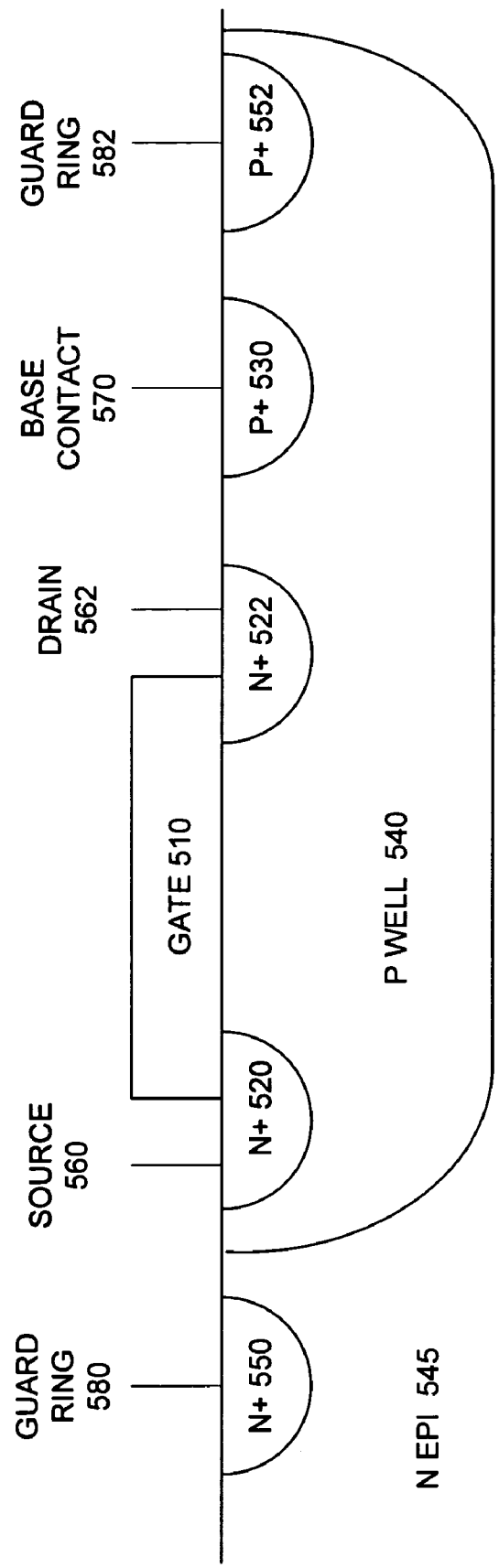
FIG. 5 is a side view of another transistor that may be used as the transistor M2 320 in FIG. 3, or as a transistor in another embodiment of the present invention.

FIG. 5 is a side view of another transistor that may be used as the transistor M2 320 in FIG. 3, or as a transistor in another embodiment of the present invention. This transistor includes a gate 510, N+ source region 520 and N+ drain region 522 that are connected to source contact 560 and drain contact 562, P+ base region 530 connected to base contact 570, guard rings 550 and 552 connected to guard ring connections 580 and 582, P-well 540, and an N epitaxial region 545.

Again, a positive charge on the gate 510 draws N-type carriers to the region below the gate in P-well 540. This allows conduction of current between the drain region 522 and source region 520. The lateral NPN device can be activated, for example, by injecting charge into the base region 540 or by pulling the base contact 570 to a sufficient voltage. When this occurs, the P-well 540 to N+ source region 520 diode turns on and begins to conduct current. This base current generates a parasitic NPN current from the drain region 522 to source region 520.

As before, it is important to avoid latch-up conditions when current is injected into the bulk of the MOS output device. Accordingly, guard rings may be included. These rings may surround all or part of the output transistor. Multiple rings may be used, for example one or more rings may be located in the P-well 540 and N epitaxial region 545. For example, guard ring 550 in N epitaxial region 545 may be connected to a high supply voltage, while guard ring 552 in the P-well 540 may be connected to ground to provide a low impedance path to ground for excess carriers in the base region or P-well 540.

Again, in various embodiments of the present invention, p-channel devices having parasitic PNP transistors can be used. For example, the types of regions shown in FIGS. 4 and 5 can be reversed. Specifically, it is common to use p-channel devices that reside in N-wells, and such is the case if the impurity types in FIG. 5 are reversed, that is, the P-type regions are made N-type, and the N-type regions are made P-type regions. In this case, a parasitic lateral PNP device assists pulling up an output voltage. In various processing technologies, however, either the lateral PNP or lateral NPN device may have certain characteristics, such as low current gain (beta) or a tendency to latch-up, that may make their use undesirable.

Figure 6:
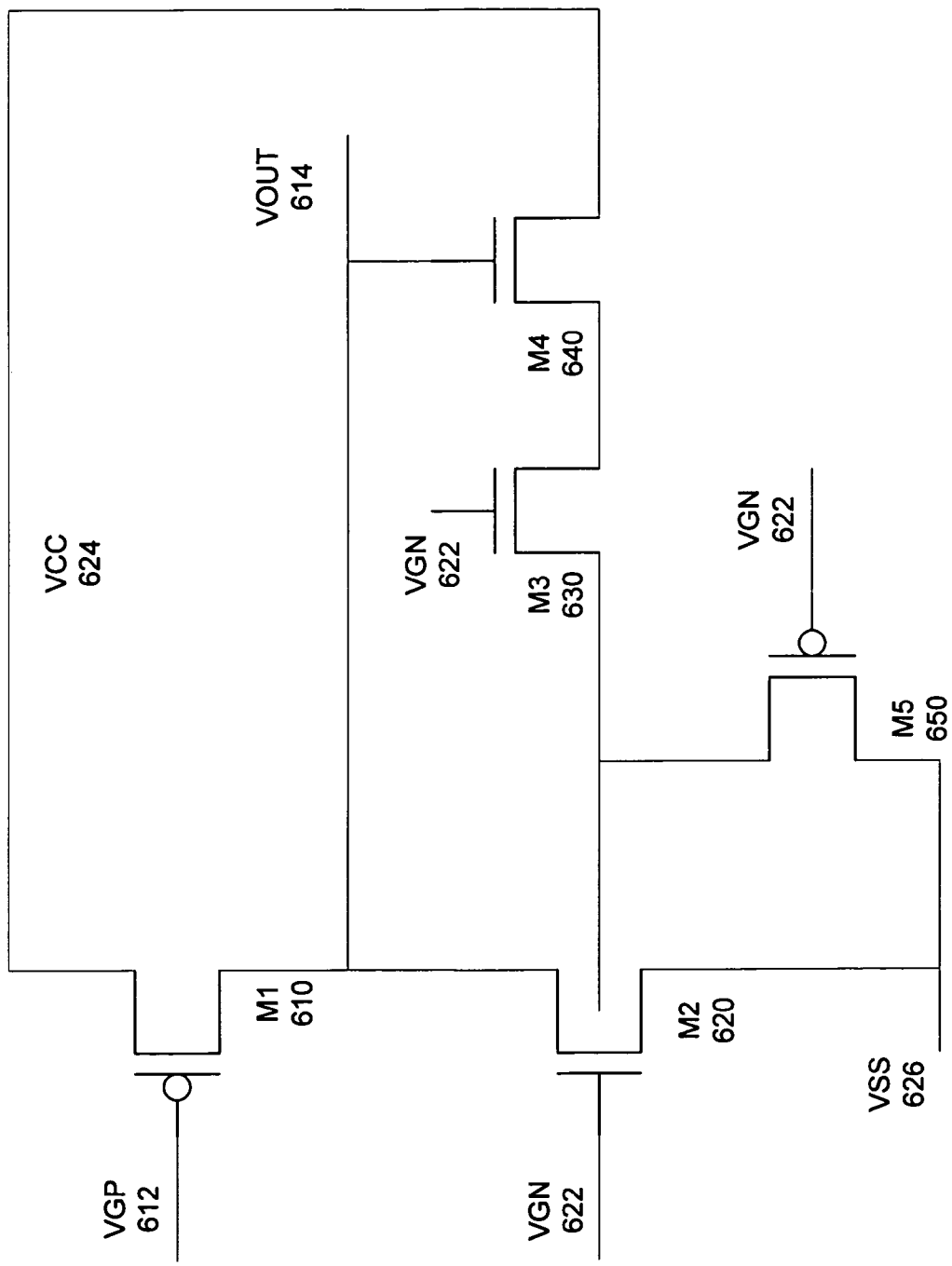
FIG. 6 is a more detailed schematic of an embodiment of the present invention.

FIG. 6 is a more detailed schematic of an embodiment of the present invention. This figure includes pull-up device M1 610 and pull-down device M2 620. This figure also includes a current path whereby current can be injected into the base of a parasitic lateral NPN formed by regions of pull-down transistor M2 620. This current path includes transistors M3 630 and M4 640. These transistors are connected between the bulk of transistor M2 620 and VCC on line 624. This figure also includes a bulk pull-down device M5 650, which is connected between the bulk of transistor M2 620 and its source or VSS on line 626.

Again, the signals VGP and VGN are received on lines 612 and 622 at the gates of transistors M1 610 and M2 620. These transistors invert the input signals and provide an output Vout on line 614. This output line may connect to a pad of an integrated circuit.

As the signal VGN on line 622 transitions from a logic low to a logic high level, transistor M2 620 turns on and begins to conduct current, thus reducing the voltage Vout on line 614. While the signal VGN on line 622 is high, transistor M3 630 conducts. Following a low-to-high transition of VGN on line 622, the output voltage Vout on line 614 remains high for some period of time. During this time, transistor M4 640 remains conducting.

Accordingly, after a low to high transition of VGN on line 622, both transistors M3 630 and M4 640 conduct thereby allowing current to flow from VCC on line 624 into the bulk of transistor M2 620. The current into the bulk of M2 620 acts as a base current for the parasitic lateral NPN transistor. This parasitic lateral NPN transistor thus turns on, providing further discharge current from Vout on line 614 to VSS on line 626.

Once Vout on line 614 returns low, transistor M4 640 turns off, thus interrupting current flow into the bulk of M2 620. At this point, the bulk of M2 620 floats. This floating can cause substrate leakage currents. Accordingly, a pull-down transistor M5 650 can be used. When the input signal VGN on line 622 returns low, M5 650 begins to conduct, thereby coupling the bulk of M2 620 to VSS on line 626. Accordingly, during various times, the bulk of transistor M2 620 is either having current injected into it, pulled out of it, or is allowed to remain floating.

Again, in various embodiments of the present invention, either or both the pull-up device or pull-down device may be improved. For example, the pull-up device 610 may have a series of transistors or other type of switch that couples its bulk to VSS on line 626 or other appropriate potential while the output is transitioning from a low to a high. Also, another switch could be used to couple the bulk of the pull-up transistor to its source during some or all of the time that current is not being injected into its base.

In this specific embodiment, the bulk of transistor M2 620 is coupled to VSS on line 626 when the signal VGN on line 622 is at a low level. In other embodiments of the present invention, this current path is active whenever current is not injected into the bulk of M2 620. In other embodiments, other timings are possible. The timing for one exemplary embodiment of the present invention is shown in the following diagram.

Figure 7:
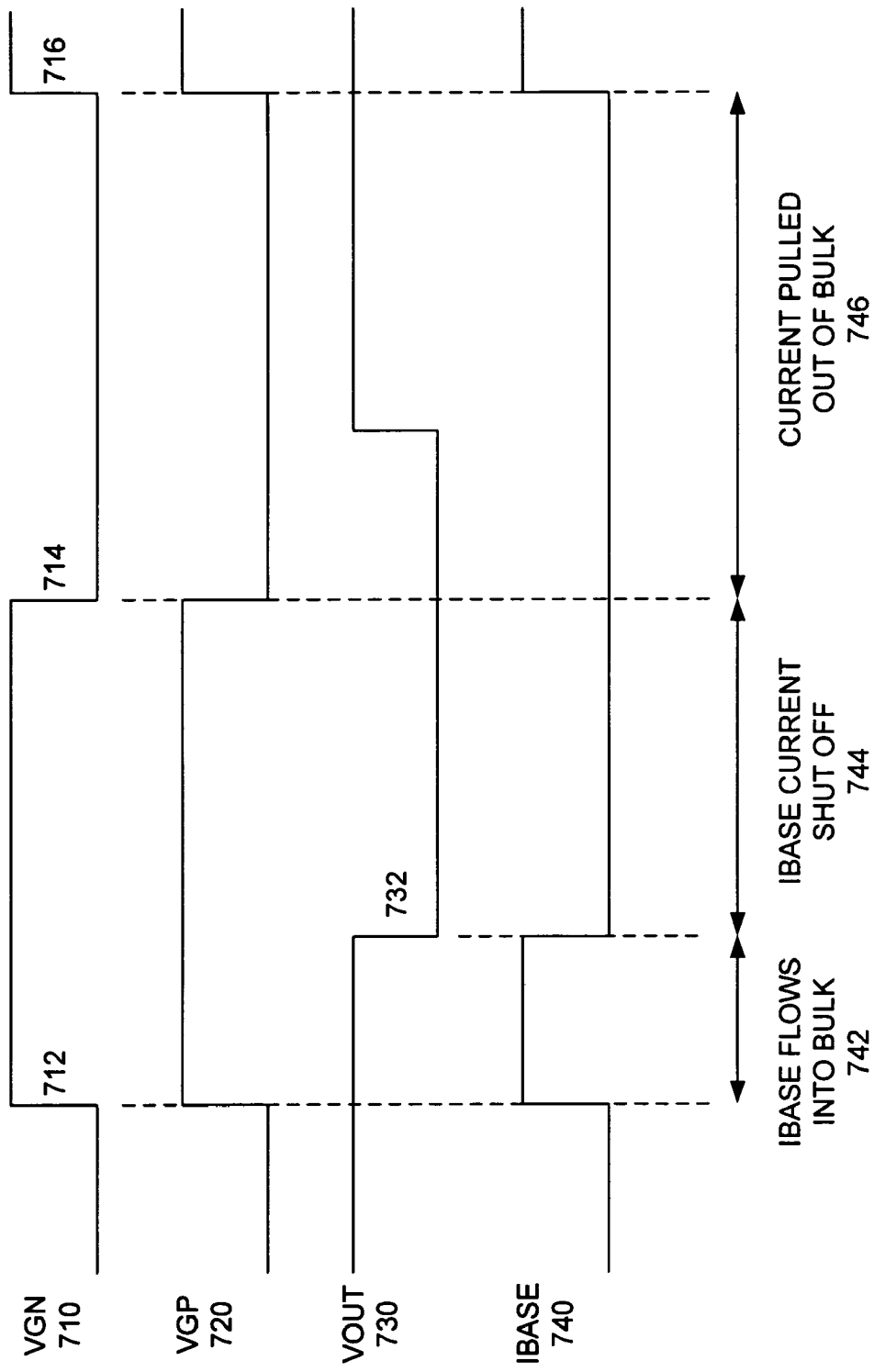
FIG. 7 is a timing diagram illustrating the operation of an embodiment of the present invention.

FIG. 7 is a timing diagram illustrating the operation of an embodiment of the present invention. This figure includes waveforms VGN 710, VGP 720, VOUT 730, and IBASE 740. In this example, VGN 710 is a signal received at the gate of an n-channel pull-down device, VGP 720 is a signal received at the gate of a p-channel pull-up device, while Vout 730 is the voltage at the drains of the pull-up and pull-down devices and IBASE 740 is a base current being injected into the bulk of the pull-down device.

Following a rising edge 712 of VGN 710, base current flows into the bulk of the pull-down transistor during time 742. Time period 742 is defined by the rising edge 712 of VGN 710 and the resulting falling edge 732 of Vout 730. Specifically, after the VGN 710 goes high before Vout 740 goes low, base current is injected into the bulk of the pull-down transistor.

Following falling edge 732 of Vout 730, the base current is shut off during time 744. Following the falling edge 714 of VGN 710, current is pulled out of the bulk of the pull-down transistor. In a specific embodiment of the present invention, this is done by connecting the bulk of the pull-down transistor to its source. Again, in various embodiments, current may be pulled out of the bulk of the pull-down transistor during time 744 as well. This timing diagram is further explained in its application to the circuitry of FIG. 6 in the following figures.

Figure 8A:
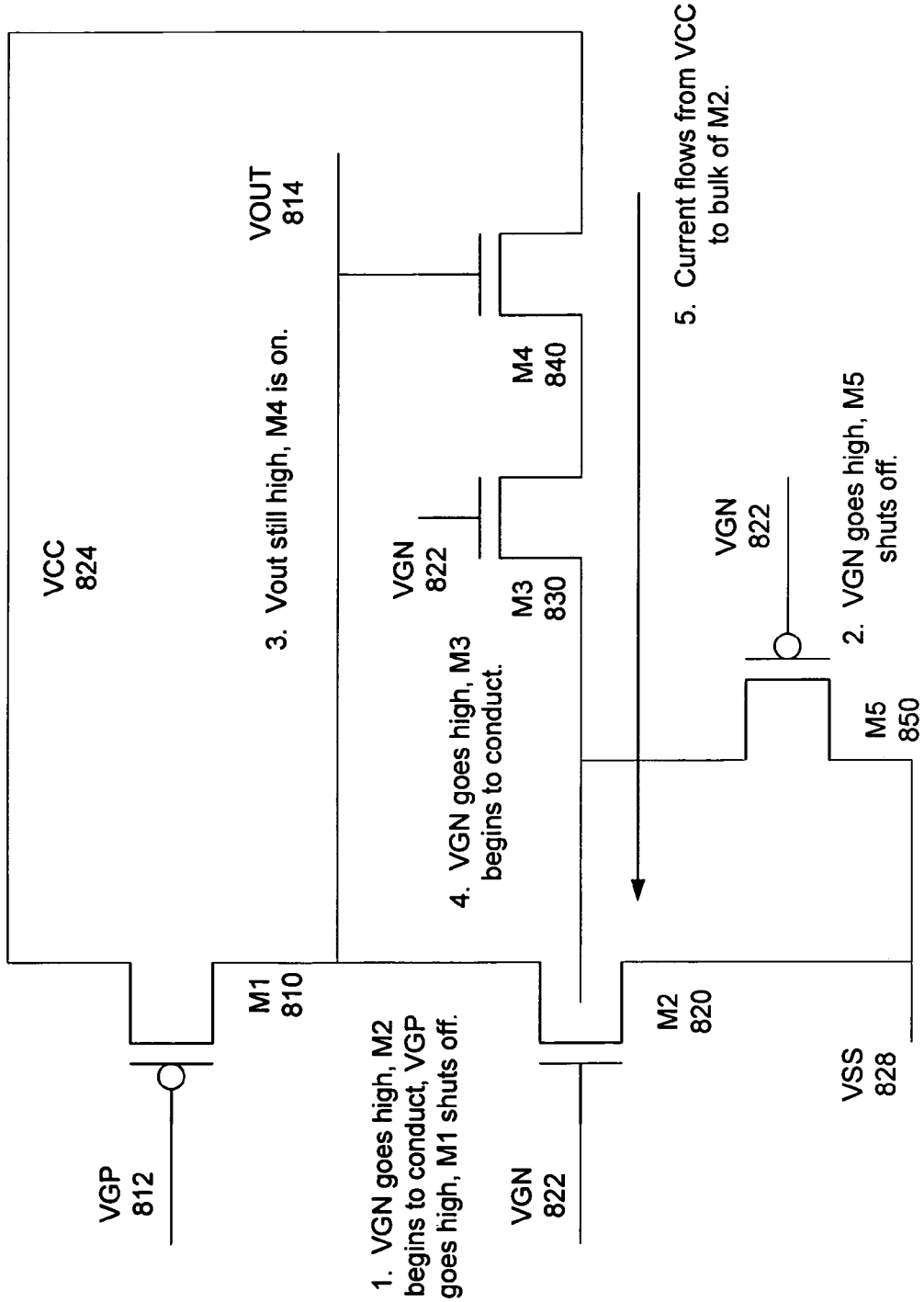
FIGS. 8A-8C illustrate the operation of the circuitry of FIG. 6.
Figure 8B:
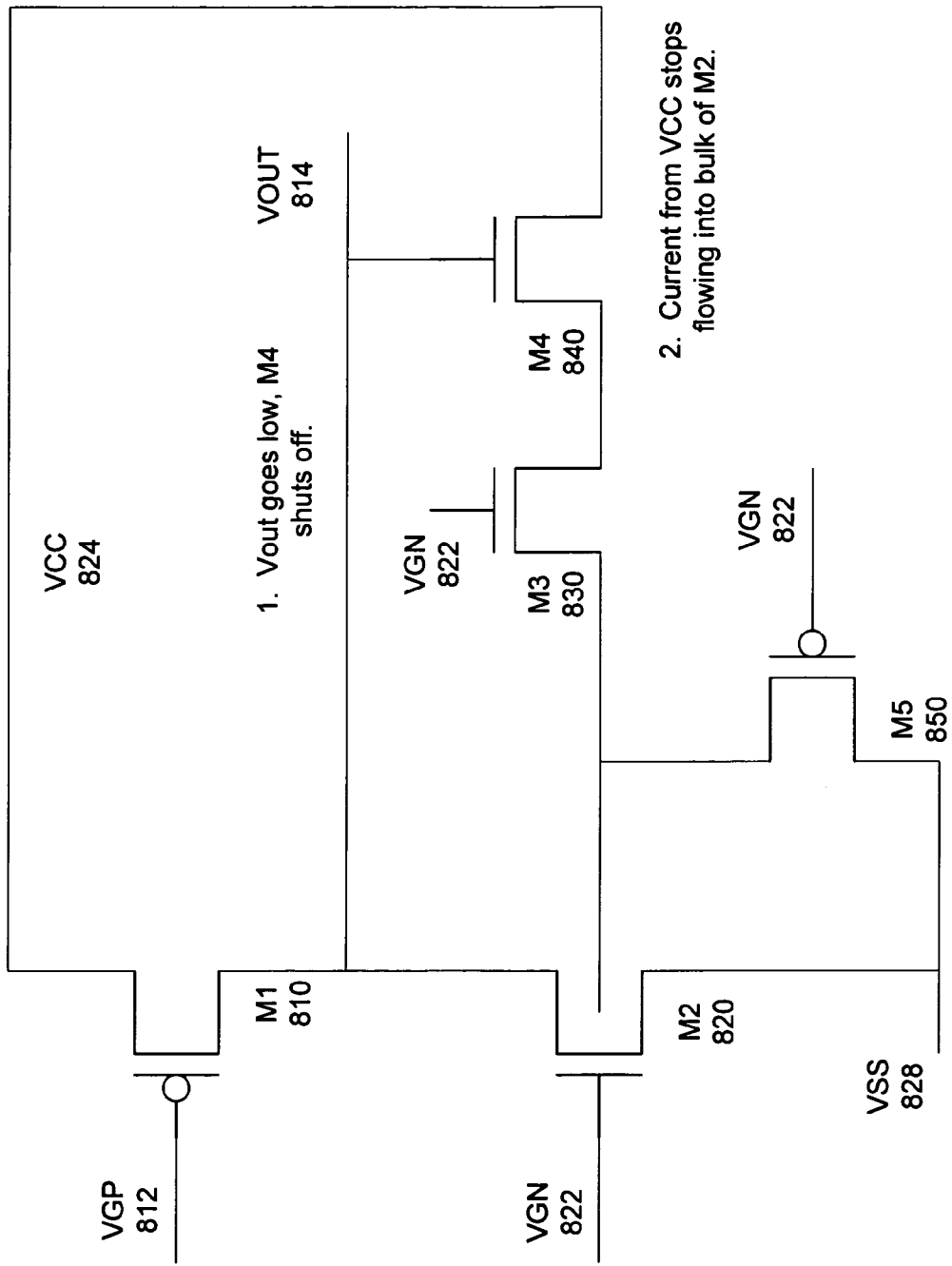
Figure 8C:
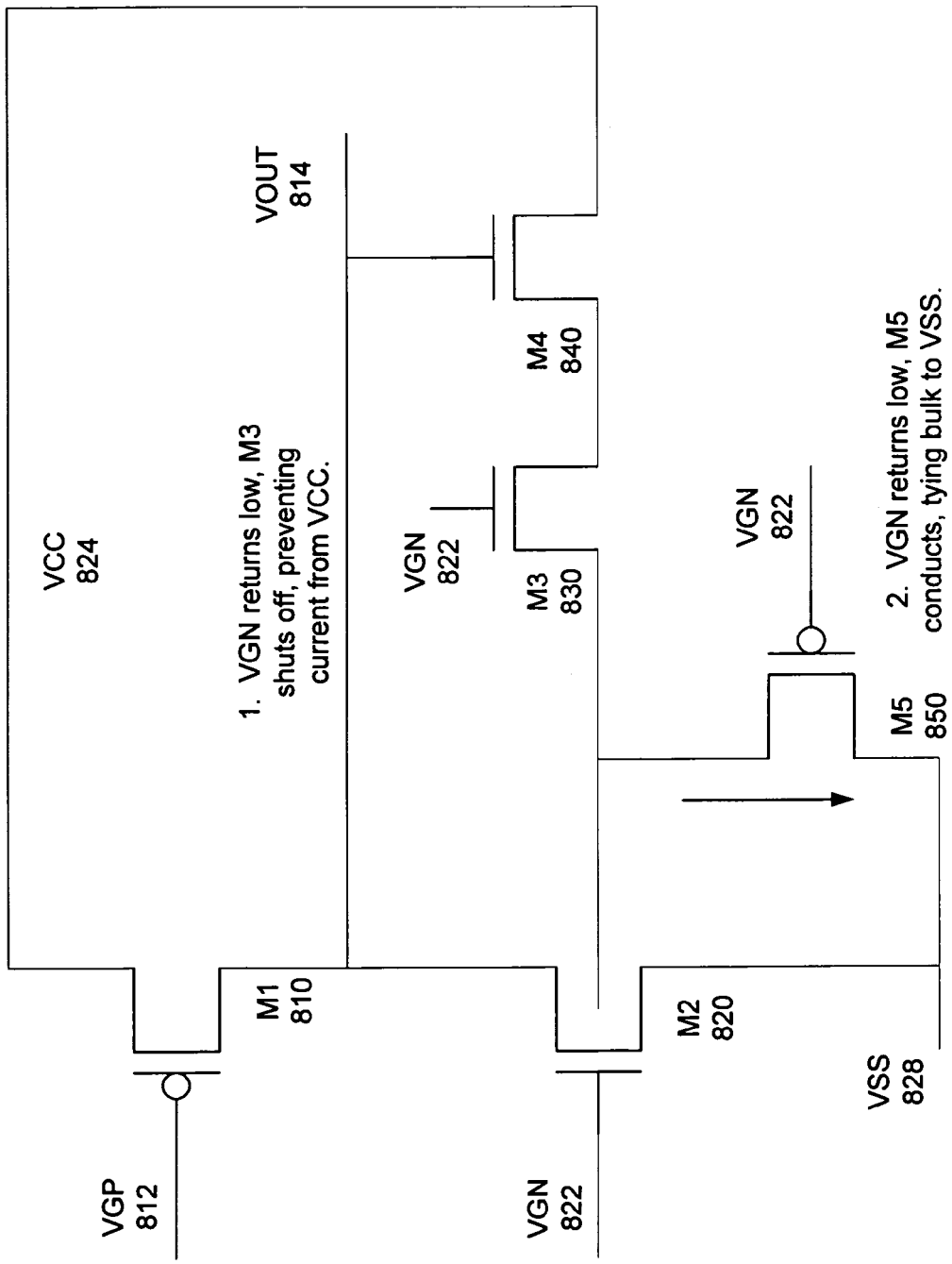

FIGS. 8A-8C illustrate the operation of the circuitry of FIG. 6. In FIG. 8A, VGP and VGN go high, M1 810 shuts off and M2 820 begins to conduct; at this time, M5 850 turns off. In a typical embodiment, VGP goes high before VGN such that M1 810 turns off before M2 820 conducts. This avoids creating a current path from VCC to VSS through M1 810 and M2 820. After VGN on line 822 goes high, Vout on line 814 remains high for some amount of time. During this time, both transistors M3 830 and M4 840 are conducting. Accordingly, current flows from VCC into the bulk of M2 820.

In FIG. 8B, Vout on line 814 goes low, shutting off M4 840. At this time, current flow from VCC into the bulk of M2 820 ceases. In FIG. 8C, VGN returns low, shutting off M3 830. This prevents current from being injected into the bulk of M2 820 as Vout on line 814 returns high. Similarly, once VGN on line 822 is low, M5 850 begins to conduct, thereby coupling the bulk of transistor M2 820 to its source and VSS on line 828.

Various embodiments may make use of various devices to implement activation of the parasitic transistor associated with M2 820. A general flow chart illustrating the operation of an embodiment of the present invention is shown in the following figure.

Figure 9:
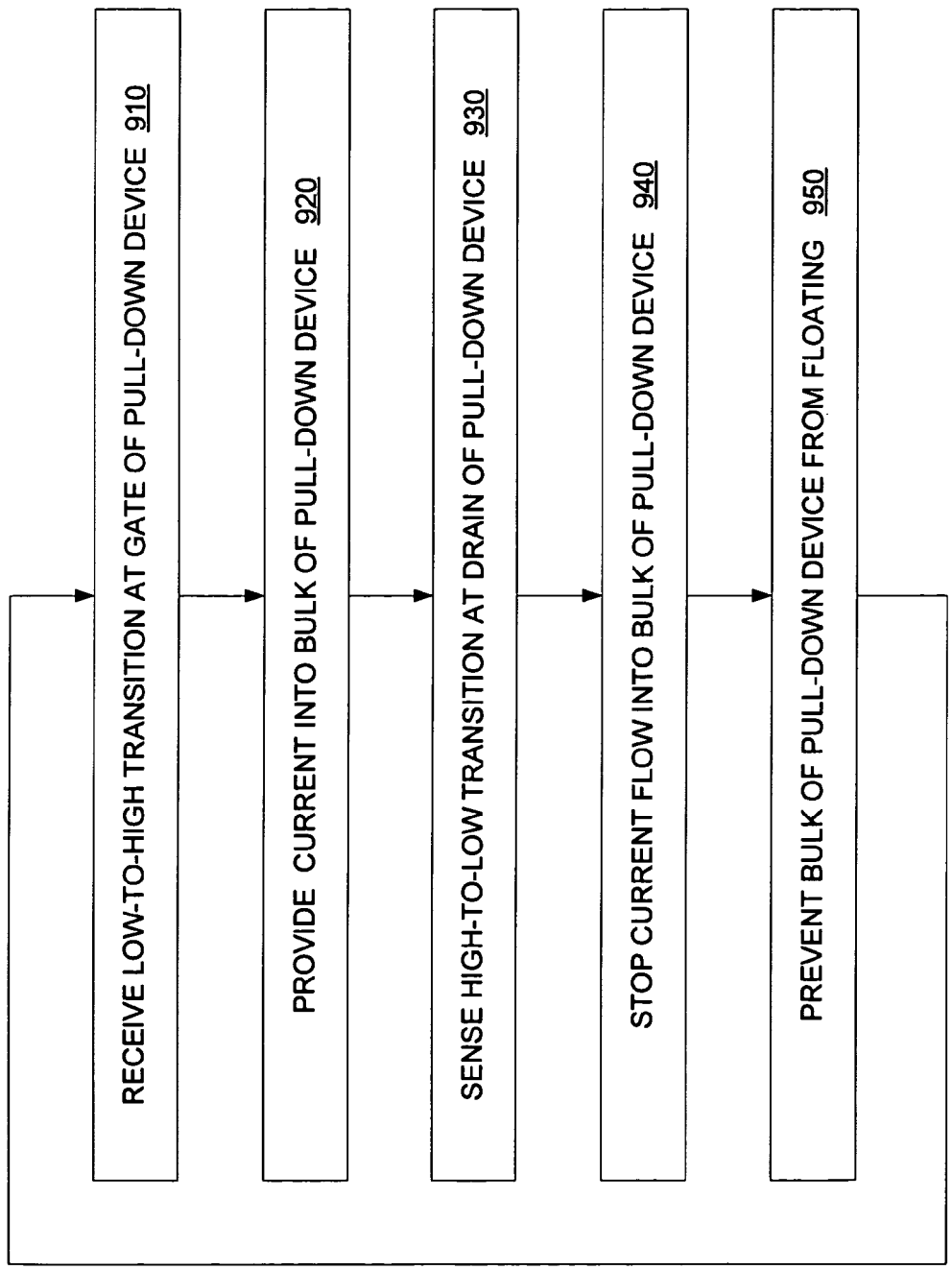
FIG. 9 is a flow chart illustrating a method providing an output signal according to an embodiment of the present invention.

FIG. 9 is a flow chart illustrating a method providing an output signal according to an embodiment of the present invention. In this figure, a base current is injected into a parasitic NPN device after its gate receives a low-to-high transition, but before its drain can complete a corresponding high-to-low transition.

Specifically, in act 910, a low-to-high transition is received at a gate of a pull-down device. In act 920, current is provided into a bulk of the pull-down device. In act 930, a high-to-low transition is sensed at the drain of the pull-down device. Following this, the current flow into the bulk of the pull-down device is stopped in act 940. For some or all of the time that current is not flowing into the bulk of the pull-down device, the bulk of the pull-down device can be prevented from floating in act 950.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A method of inverting a first signal comprising:
   receiving a low-to-high transition for the first signal at a gate of a pull-down device;
   providing a current into a bulk of the pull-down device;
   sensing a high-to-low transition at a drain of the pull-down device; then
   preventing current from flowing into the bulk of the pull-down device.

2. The method of claim 1 wherein current is provided into the bulk of the pull-down device by coupling the bulk of the pull-down device to a first voltage.

3. The method of claim 2 further comprising:
   preventing the bulk of the pull-down device from floating.

4. The method of claim 3 further comprising:
   coupling the bulk of the pull-down device to a source of the pull-down device.

5. An integrated circuit comprising:
   an output device having a bulk, a gate, and a drain;
   a first switch coupled between the bulk of the output device and a first voltage terminal,
   wherein the first switch couples the bulk of the output device to the first voltage terminal when a second voltage at the gate of the pull-down device is at a first logic level and a third voltage at the drain of the pull-down device is at the first logic level.

6. The integrated circuit of claim 5 wherein the output device is a pull-down device.

7. The integrated circuit of claim 5 wherein the first switch disconnects the bulk of the output device from the first voltage terminal when the second voltage at the gate of the output device is at a second logic level.

8. The integrated circuit of claim 5 wherein the first switch disconnects the bulk of the output device from the first voltage terminal when either the second voltage at the gate of the output device or the third voltage at the drain of the output device are at a second logic level.

9. The integrated circuit of claim 8 wherein the first logic level is a logic high and the second logic level is a logic low.

10. The integrated circuit of claim 9 further comprising:
    a second switch coupled between the bulk of the pull-down device and a source of the pull-down device;

wherein the second switch couples the bulk of the pull-down device to the source of the pull-down device when the second voltage at the gate of the pull-down device is at the second logic level.

11. The integrated circuit of claim 5 wherein the first voltage terminal is a positive power supply terminal.

12. The integrated circuit of claim 5 wherein the source of the pull-down device is coupled to ground.

13. The integrated circuit of claim 5 wherein the drain of the pull-down device is coupled to a pad on the integrated circuit.

14. An integrated circuit comprising:
   an output transistor having a gate coupled to receive a first signal; and
   a series of transistors coupled between a bulk of the output transistor and a first voltage terminal, the series of transistors comprising:
      a first transistor having a gate coupled to the drain of the output transistor; and
      a second transistor having a gate coupled to the gate of the output transistor.

15. The integrated circuit of claim 14 further comprising a pad coupled to the drain of the output transistor.

16. The integrated circuit of claim 15 further comprising a first transistor coupled between the bulk of the output transistor and a source of the output transistor.

17. The integrated circuit of claim 15 wherein the output device is an n-channel MOS transistor.

18. The integrated circuit of claim 17 wherein the source of the output device is coupled to ground.

19. The integrated circuit of claim 18 wherein the first voltage terminal is a positive supply voltage for the integrated circuit.

20. The integrated circuit of claim 15 wherein the integrated circuit is a field programmable gate array.

* * * * *